United States Patent
Cave

(10) Patent No.: US 6,654,900 B1
(45) Date of Patent: Nov. 25, 2003

(54) METHOD AND APPARATUS FOR PRODUCING MULTIPLE CLOCK SIGNALS HAVING CONTROLLED DUTY CYCLES BY CONTROLLING CLOCK MULTIPLIER DELAY ELEMENTS

(75) Inventor: Michael D Cave, Pflugerville, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/553,129

(22) Filed: Apr. 19, 2000

(51) Int. Cl.[7] ............................. G06F 1/06; H03K 3/017
(52) U.S. Cl. ..................... 713/501; 327/175; 327/116; 327/269
(58) Field of Search ..................... 713/501; 327/175, 327/116, 269

(56) References Cited

U.S. PATENT DOCUMENTS

| | | | | |
|---|---|---|---|---|
| 5,391,996 A | * | 2/1995 | Marz ........................ | 327/158 |
| 5,457,719 A | * | 10/1995 | Guo et al. ................ | 375/373 |
| 5,614,855 A | * | 3/1997 | Lee et al. ................. | 327/158 |
| 5,757,218 A | * | 5/1998 | Blum ........................ | 327/175 |
| 5,818,270 A | * | 10/1998 | Hamza ..................... | 327/116 |
| 5,930,689 A | * | 7/1999 | Wilhite et al. .......... | 455/126 |
| 5,963,071 A | * | 10/1999 | Dowlatabadi ............ | 327/175 |
| 6,150,847 A | * | 11/2000 | Lu ............................ | 326/93 |
| 6,369,622 B1 | * | 4/2002 | Lim et al. ................. | 327/116 |
| 6,441,659 B1 | * | 8/2002 | Demone .................... | 327/156 |

* cited by examiner

Primary Examiner—Thomas Lee
Assistant Examiner—Eric Chang
(74) Attorney, Agent, or Firm—Timothy W. Markison

(57) ABSTRACT

A method and apparatus for producing multiple clock signals having controlled duty cycles and phase relationships includes processing that begins by generating a plurality of delayed clock signals from an input clock signal based on a delay control signal. The processing then continues by producing a first multiple clock signal from a first set of a plurality of delayed clock signals and the input clock signal. The processing then continues by producing a second multiplied clock signal from a second set of the plurality of delayed clock signals, where the second multiplied clock signal is delayed from the first multiplied clock signal in accordance with a delay of at least one of the delayed clock signals. The processing then continues by generating the delayed control signal based on the first multiplied clock signal, where the delay control signal controls delays of the plurality of delayed clock signals.

14 Claims, 4 Drawing Sheets

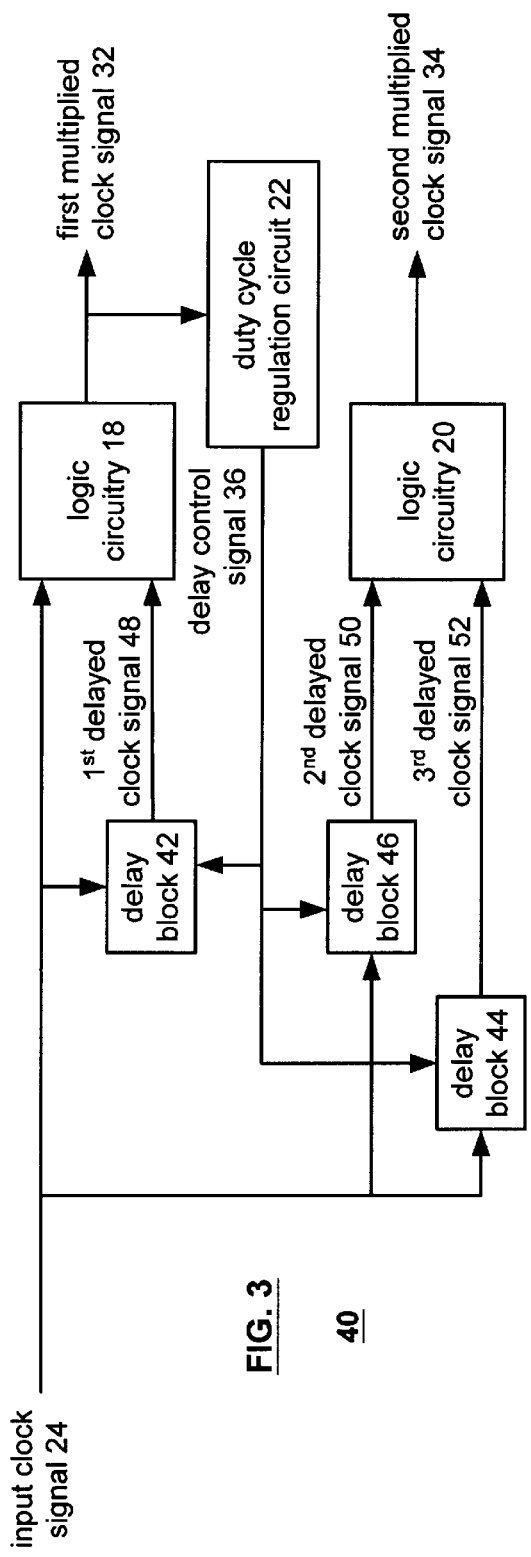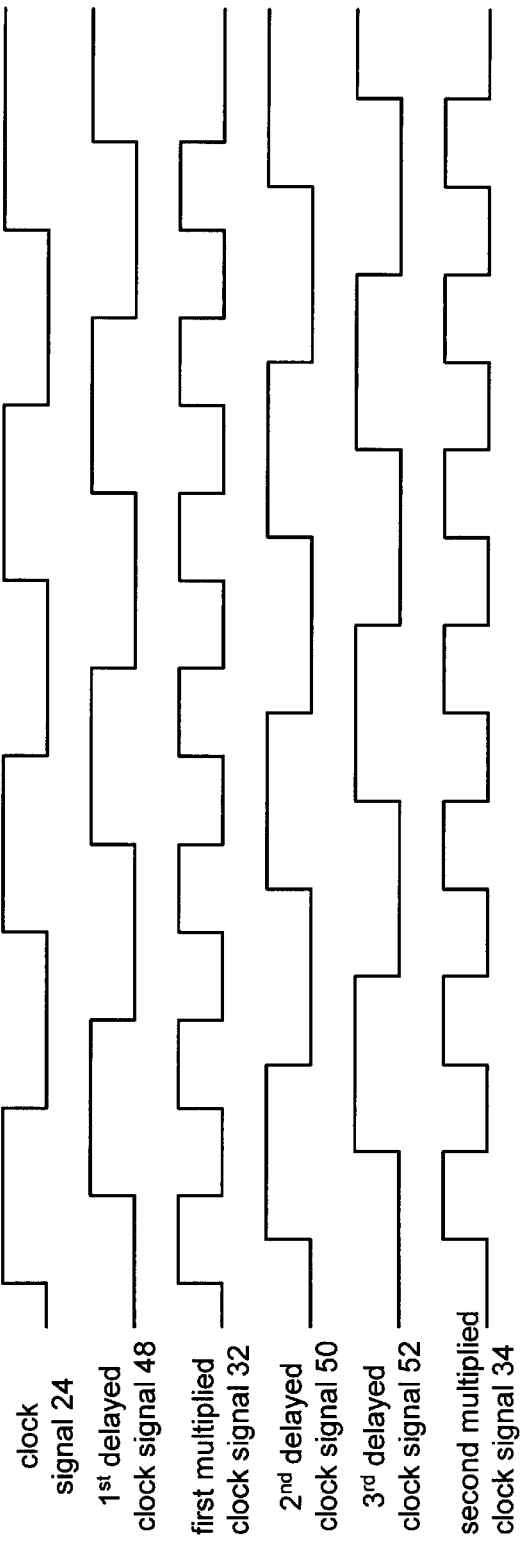

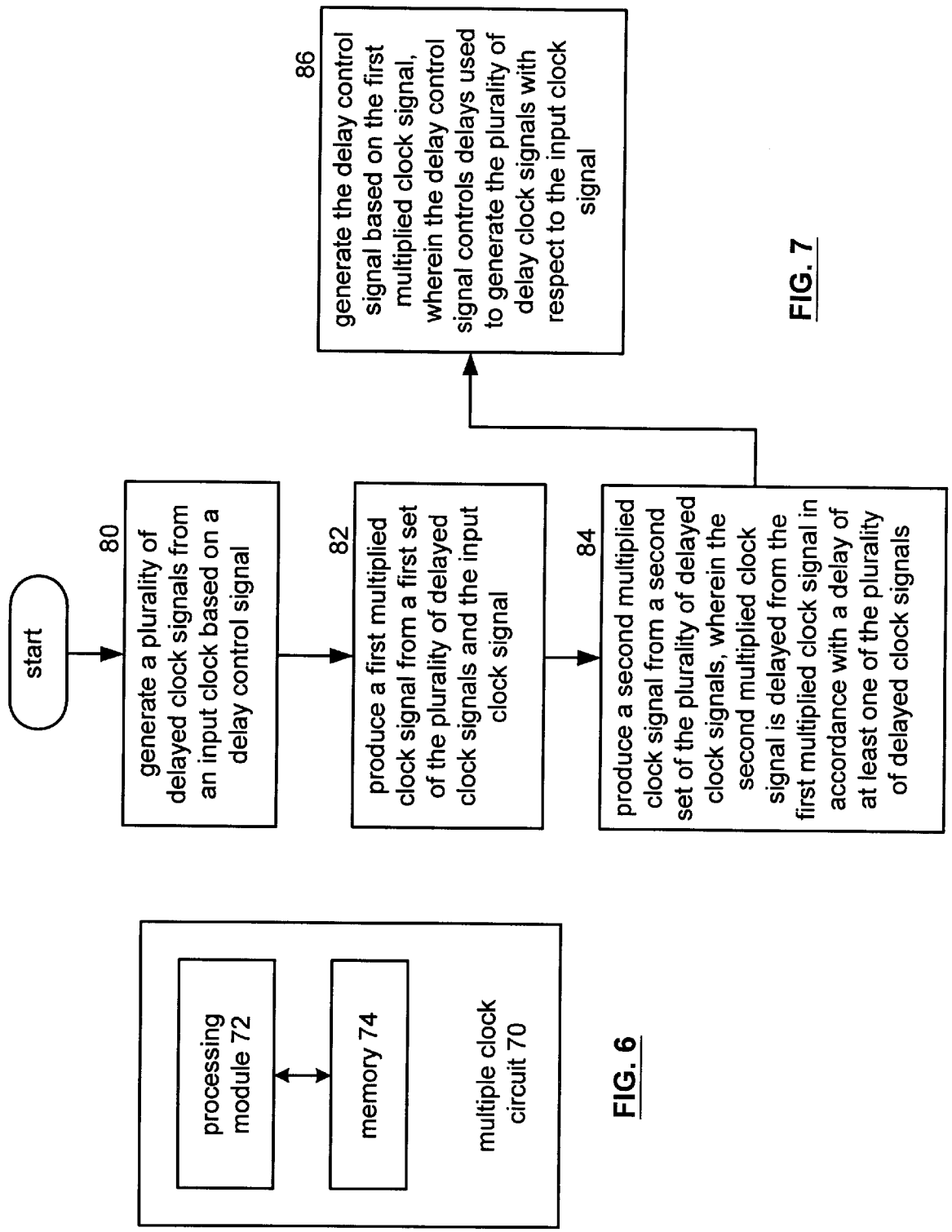

METHOD AND APPARATUS FOR PRODUCING MULTIPLE CLOCK SIGNALS HAVING CONTROLLED DUTY CYCLES BY CONTROLLING CLOCK MULTIPLIER DELAY ELEMENTS

TECHNICAL FIELD OF THE INVENTION

This invention relates generally to clock circuits and more particularly to method and apparatus for producing multiple clock signals and controlling the duty cycle of the multiple clock signals.

BACKGROUND OF THE INVENTION

Clock signals are used in a variety of data processing applications to ensure proper processing of data. Typically, a reference clock signal will be received or generated which multiple other clock signals are produced. The reference clock signal may be multiplied up to a higher frequency or divided down to a lower frequency. A combination of multiplying and dividing clock signals allows for many multiples of the referenced clock to be generated (integer or real multiplication).

A phase lock loop (PLL) or a "one shot" circuit may be used to generate a high frequency clock from the referenced clock signal. This is done in many applications to generate a higher frequency clock or to generate a clock frequency that is not an integer multiplication (or division) of the referenced clock frequency. For example, a 22.05 megahertz clock signal may be generated from a 24 megahertz clock signal by using frequency dividers and a phase lock loop. In particular, the 24 megahertz clock signal may be divided by 40, to generate a 600 kilohertz clock signal, which is then multiplied by 147 via a phase lock loop producing a clock having a rate of 88.2 megahertz. The 88.2 megahertz clock signal is then divided by 4 to produce a clock signal of 22.05 megahertz. The result is a real frequency multiplication of the 24 megahertz reference clock by 0.91875.

In many applications, the resulting clock signal is used to trigger transference of data from one data processing circuit to another. The data may be transferred on the rising edge of the clock signal or the falling edge of the clock signal. Thus, when designing a clock for such data transference the accuracy of the clock rate was a primary factor and maintaining a duty cycle of 50% was a distant secondary concern. However, in more recent data processing circuits, data is processed on the rising and falling edges often referred to double edge processing, which is done to improve processing speed, reduce power and reduced die size. For example, as the manufacturing process technology of integrated circuits improve, transistor speeds are increasing, which are allowing processors to complete instructions in a single clock phase as oppose to many cycles. This allows for more instructions to be processed using less circuitry, which reduces both power consumption and die size. However, for double-edged data processing, the data clock is required to have a duty cycle of 50%.

As is known, a 50% duty cycle allows an equal amount of time for processing data on the rising edge as for processing data on the falling edge. If the duty cycle of the clock is not approximately 50%, such as the case of a 60%–40% duty cycle, the processing system would be required to operate at the minimum cycle time set by the 40% duty cycle. For example, if the system is operating with a 24 megahertz clock, the half period of a 50% duty cycle is 20.83 nanoseconds. However, if the minimum half cycle is constrained by a 40%–60% duty cycle clock, the minimum half cycle period is 16.67 nanoseconds, which would be the maximum time for the processor to process an instruction. This is a 4.16 nanosecond reduction of processing time when compared to a 50% duty cycle. With current processing speeds, a reduction of 4.1 nanoseconds is a significant loss of processing power (measured in MIPs).

Typically, a 50% duty cycle system clock is generated from the referenced clock using a multiplying circuit, such as a PLL. It is well known that an analog PLL consumes a great amount of die area and consumes a reasonable amount of power. For large multiplication factors, an analog PLL is an acceptable method. However, for lower frequency multiplication factors, such as multiplying by two or four, the analog PLL is not a good design choice.

A one-shot circuit produces an output pulse that is based on the rising and falling edges of the referenced clock. In effect, a one-shot multiplies the referenced signal frequency by 2. A simple one-shot circuit comprises two input exclusive OR gates (XOR) and some delay elements (usually an even number of inverters). The one-shot is built by directly connecting one of the two XOR inputs to the referenced clock signal. The other XOR input is connected to the delay chain, and is therefore receiving a delayed version of the referenced clock. The one-shot circuit output will pulse high on the rising edge and falling edge of the referenced clock signal. The high pulse will only be as wide as the delay of the delay chain. As such, the one-shot circuit multiplies the referenced clock signal by 2 and does not consume as much power, or area, as an analog PLL. However, the one-shot circuit does not produce a reliable 50% duty cycle because the delay chain is highly sensitive to process variation, temperature variation, and power supply variation.

In addition, a one-shot circuit, due to these sensitivities, is difficult to utilize in a multiple clock environment where the phase differences between clocks of the same rate are to be controlled. Therefore, a need exists for a method and apparatus that provides the simplicity of a one-shot clock multiplication circuit with a control duty cycle of an analog PLL for producing multiple clock signals having a control phase relationship.

BRIEF DESCRIPTION OF THE DRAWINGS

FIG. 3 illustrates a schematic block diagram of an alternate clock circuit in accordance with the present invention;

FIG. 4 illustrates a timing diagram of clock circuit of FIG. 3;

FIG. 6 illustrates a schematic block diagram of a multiplying clock circuit in accordance with the present invention; and FIG. 7 illustrates a logic diagram of a method for producing multiple clock signals having controlled duty cycles and phase relationships in accordance with the present invention.

DETAILED DESCRIPTION OF A PREFERRED EMBODIMENT

Generally, the present invention provides a method and apparatus for producing multiple clock signals having controlled duty cycles and phase relationships. Such a method and apparatus includes processing that begins by generating a plurality of delayed clock signals from an input clock signal based on a delay control signal. The processing then continues by producing a first multiple clock signal from a first set of a plurality of delayed clock signals and the input clock signal. The processing then continues by producing a second multiplied clock signal from a second set of the plurality of delayed clock signals. Note that the second multiplied clock signal is delayed from the first multiplied clock signal in accordance with a delay of at least one of the delayed clock signals. Further note that the first and second multiplied clocks have duty cycles that can be controlled to 50%. The processing then continues by generating the delayed control signal based on the first multiplied clock signal. Note that the delay control signal controls delays used to produce the plurality of delayed clock signals with respect to the input clock signal. With such a method and apparatus, a clock circuit may be devised where the duty cycles are regulated and the phase relationships between multiple clocks is controlled with the advantageous control of an analog PLL and the simplicity of a one-shot clock circuit.

Figure 1:
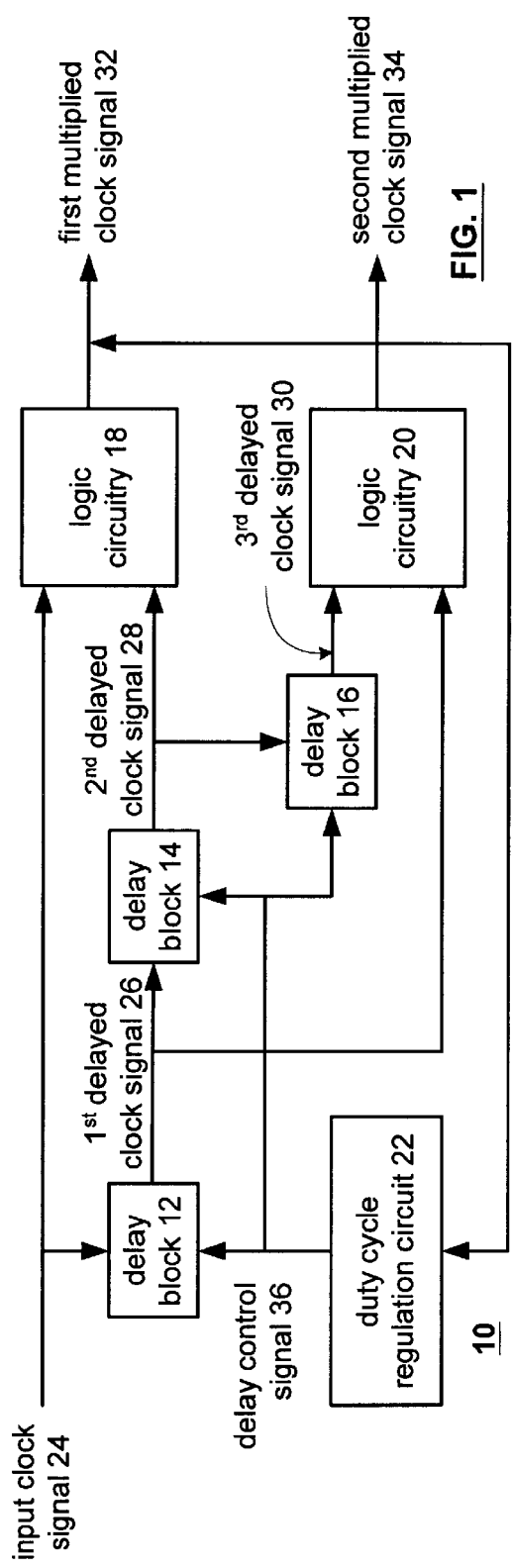
FIG. 1 illustrates a schematic block diagram of a clock circuit in accordance with the present invention.

The present invention can be more fully described with reference to FIGS. 1 through 7. FIG. 1 illustrates a schematic block diagram of a clock circuit 10 that includes a plurality of delay blocks, 12, 14, 16, a plurality of logic circuits 18 and 20 and a duty cycle regulation circuit 22. As configured, the clock circuit 10 will produce a first multiplied clock cycle signal 32 and a second multiplied clock signal 34. Note that additional delay blocks and logic circuits may be included in the clock circuit 10 to produce more than two clock signals.

In operation, an input clock signal 24 is received by delay block 12 and logic circuitry 18. Delay block 12 produces a first delayed clock signal 26 from the input clock signal 24. Delay block 14 receives the first delayed clock signal 26 and produces a second delayed clock signal 28 therefrom. The logic circuitry 18 performs a Boolean function of $A\overline{B} \oplus \overline{A}B$ to produce the first multiplied clock signal 32.

The delay block 16 receives the second delayed clock signal 28 and produces a third delayed clock signal 30. Logic circuitry 20 is operably coupled to receive the first delay clock signal 26 and the third delayed clock signal 30. Utilizing the Boolean function of $A\overline{B} \oplus \overline{A}B$, the logic circuitry 20 produces the second multiplied clock signal 34.

The duty cycle regulation circuit 22 is operably coupled to receive the first multiplied clock signal 32 and produces therefrom a delay control signal 36. The delay control signal 36 is provided to each of the delay blocks 12, 14, and 16 and controls the delay. As such, the delay control signal 36 defines the delay between the first delayed clock signal 26 and the input clock signal 24 produced by delay block 12. The other delay blocks 14 and 16 have the same delay relationship between their input clock signal and their output clock signal.

Figure 2:
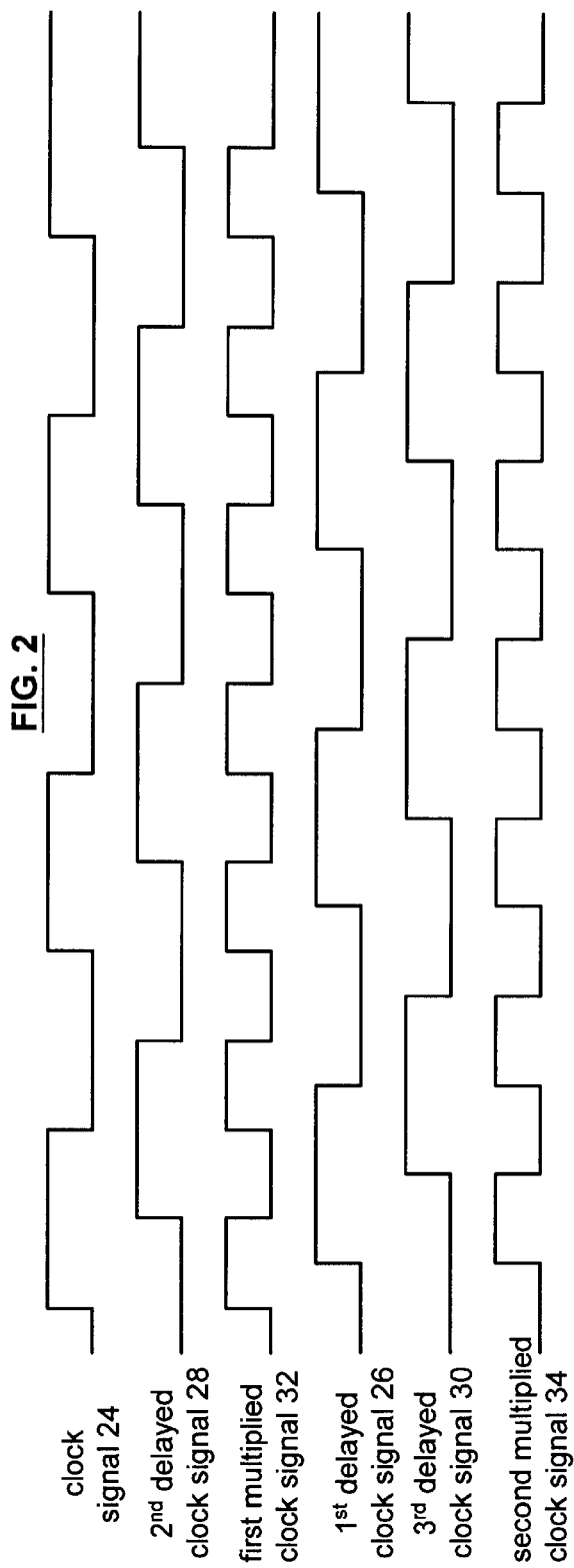
FIG. 2 illustrates a timing diagram of the clock circuit of FIG. 1.

FIG. 2 illustrates a timing diagram of the clock circuit of FIG. 1. As shown, the clock circuit 24 has an even frequency and duty cycle. The logic circuitry 18, as mentioned, is operably coupled to receive the second delayed clock signal 28 and the input clock signal 24. In a particular embodiment, the duty cycle regulation circuit 22 produces the delay control signal 36 such that each of the delay blocks 12, 14 and 16 delay their respective output signal from their respective input signal by one-eighth of a period. As such, the second delay clock signal 28 is delayed by one-quarter of a period from clock signal 24. The logic circuitry 18 performs a Boolean function, such as an exclusive OR, upon the clock signal 24 and the second delayed clock signal 28. The resultant is the first multiplied clock signal 32. As shown, the first multiplied clock signal 32 has a frequency twice that of the clock signal 24 and is produced by an exclusive OR function such that whenever either of the clock signal 24 or the second delayed signal 28 is exclusively high, the first multiplied clock signal 32 will be high.

Logic circuit 20 produces the second multiplied clock signal 34 based on the first delayed clock signal 26 and the third delayed clock signal 30. As shown, the first and third delayed clock signals are one-quarter out of phase with respect to each other where the first delayed clock signal 26 is one-eighth of a period delayed from clock signal 24.

FIG. 3 illustrates an alternate clock circuit 40 that includes logic circuit 18, logic circuit 20, duty cycle regulation circuit 22 and a plurality of delayed blocks 42, 44 and 46. In this embodiment, the duty cycle regulation circuit 22 generates individual delay control signals 26 for each of the delay blocks 42, 44, and 46. Alternatively, a single delay control signal 36 may be generated and each of the delay blocks 42, 44 and 46 would include a differing number of delay elements to produce the varying delays.

With respect to FIGS. 3 and 4, delay block 42 produces the first delayed clock signal 48 that is one-quarter of a cycle out a phase with respect to the input clock signal 24. Logic circuitry 18 upon receiving the first delayed clock signal 48 and clock signal 24 produces the first multiplied signal 32. Logic circuitry 20 receives the second delayed clock signal 50 and the third delayed clock signal 52. The second clock delayed signal 50 is one-eighth of a cycle out of a phase with respect to input clock 24 and the third delayed clock signal 52 is three-eighths of a cycle out of a phase with respect to the input clock signal 24. As such, delay block 42 has twice the number of delay elements as delay block 46 and delay block 44 has three times the number of delay elements as delay block 46. The details of the delay elements will be discussed with reference to FIG. 5.

Figure 5:
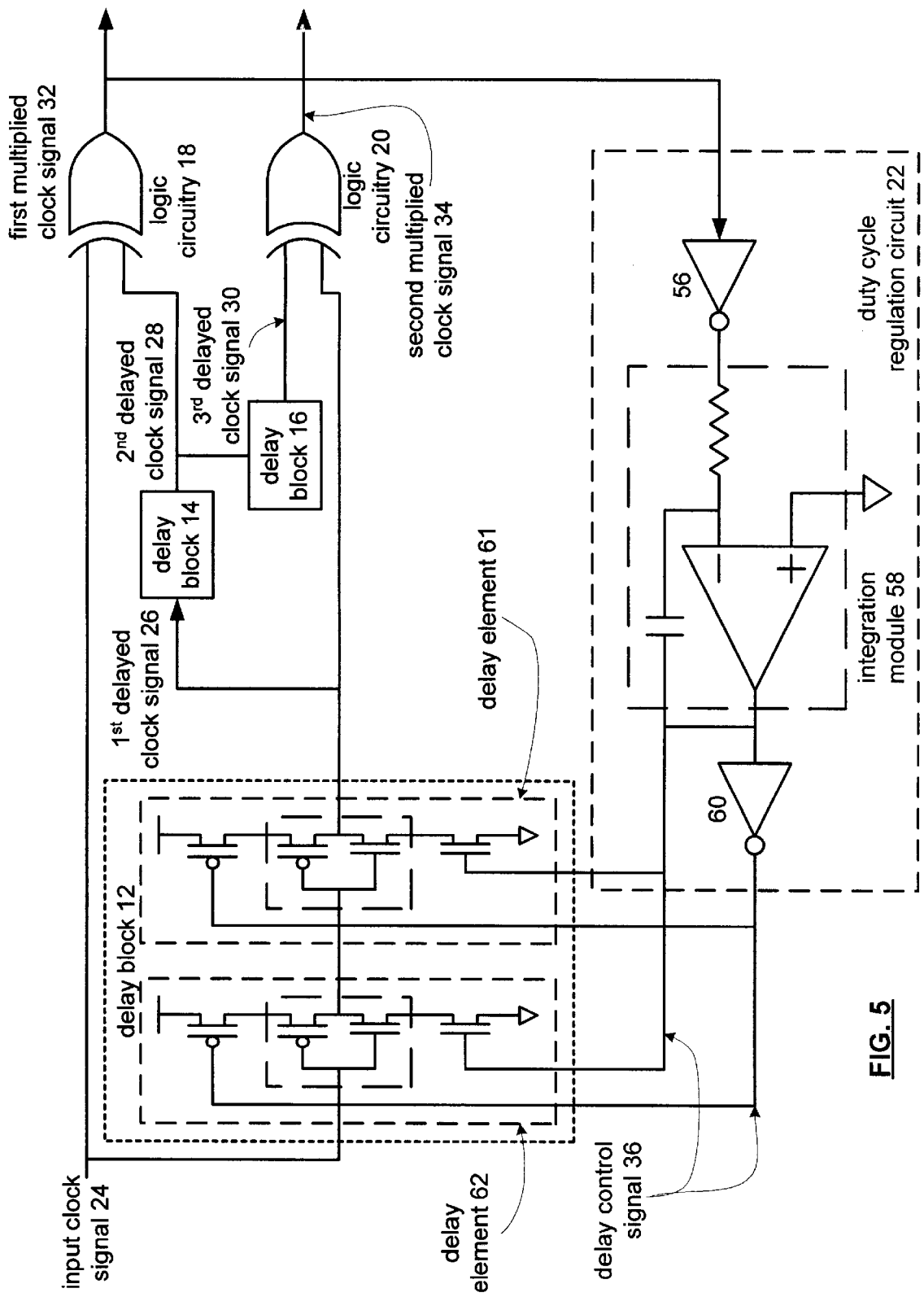
FIG. 5 illustrates a more detailed schematic block diagram of the clock circuit of FIG. 1.

FIG. 5 illustrates a more detailed schematic block diagram of clock circuit 10 of FIG. 1. Note that the delay blocks 12, 14 and 16 include a plurality of delay elements 60 and 62. As one of average skill in the art will appreciate, the delay element 61 and 62 may also be utilized in the delay blocks 42, 44 and 46 of FIG. 3 wherein each of the delay blocks include a differing number of delay elements as previously discussed.

Delay block 12 is a representative of delay blocks 14 and 16 and includes delay element 61 and delay element 62. Each of the delay elements 61 and 62 includes an inverter and current starvation transistors. The inverter includes an N-channel transistor and a P-channel transistor and the starvation transistors also include an N-channel and P-channel transistor. The N-channel and P-channel transistors are operably coupled to receive the delay control signal 36 such that the starvation transistors control the delay of the delay element 61 or 62. By utilizing identical circuitry in each of the delay blocks and utilizing the same delay control signal 36, the delay through each of delay blocks 12, 14 & 16 is substantially similar.

The duty cycle regulation circuit 22 is shown in greater detail to include an inverter 56, an integration module 58 and an output inverter 60. The inverter 56 receives the first multiplied clock signal 32 and produces an inverted representation thereof. In addition, inverter 56 decouples the first multiplied clock signal 32 from the integration module 58, thereby not loading the first multiplied clock signal 32 with the integration module 58. The integration module 58 receives the inverted clock signal and integrates it via an operational amplifier and a resistor-capacitor (RC) feedback network. The RC feedback network is selected to have a time constant T that is much greater than the period of the first multiplied clock signal 32. For example, the time constant T is set by the R×C product (T=R×C) which is much, much greater than (one/frequency) of clock 32.

Once the steady state of the integration module 58 is achieved, the average output voltage of inverter 56 will be VDD divided by 2, which is the analog ground voltage input of the operational amplifier. The delay control signal 36 is the output signal of the operational amplifier and is referenced with respect to analog ground. The delay control signal is also generated from inverter 60. Note that inverter 60 may be altered such that it includes a strong N-channel device and a weak P-channel device. The device size of the strong N-channel device and the weak P-channel device are calibrated so that the delay control signal to the P-channel starvation transistor is approximately (minus 1) times (delay control signal 36), with respect to analog ground. For example, when VDD is equal to three volts, the analog ground is equal to 1.5 volts. If the delay control signal 36 is (minus 0.5 volts) then the delay signal to the P channel transistors is approximately 0.5 volts. These voltages are references to absolute ground (VSS), then VSS is equal to zero volts, VDD is equal to three volts, analog ground is equal to 1.5 volts, the delay control signal to the end-channel transistors, the N-channel starvation transistors, of the delay elements is equal to one volt and the delay control signal 36 to the P-channel starvation transistors of delay elements is equal to 2 volts. Note that the integration module 58 may be a differential circuit.

FIG. 6 illustrates a schematic block diagram of a multiplying clock circuit 70 that includes a processing module 72 and memory 74. The processing module 72 may be a single processing device or a plurality of processing devices. Such a processing device may be a microprocessor, microcontroller, microcomputer, digital signal processor, logic circuitry, state machine, and/or any other device that manipulates signals (analog or digital) based on operational instructions. The memory, which stores the operational instructions, may be a single memory device or a plurality of memory devices. Such a memory device may be a read-only memory, random access memory, floppy disk memory, hard drive memory, external memory, and/or any device that stores digital information. Note that when the processing module 72 implements one or more of its functions via a state machine or logic circuitry, the memory storing the corresponding operational instructions is embedded within the circuitry comprising the state machine or logic circuitry. The operational instructions stored in memory 74 and executed by processing module 72 are illustrated in processing steps in the logic diagram of FIG. 7.

FIG. 7 illustrates a logic diagram of a method for producing multiple clock signals having controlled duty cycles and controlled phase relationships. The process begins at step 80 where a plurality of delayed clock signals is generated from an input clock based on a delay control signal. The process then proceeds to step 82 where a first multiplied clock signal is produced from a first set of the plurality of delay clock signals and the input clock signal. The process then proceeds to step 84 where a second multiplied clock signal is produced from a second set of the plurality of delayed clock signals. Note that the second multiplied clock signal is delayed from the first multiplied clock signal in accordance with a delay of at least one of the plurality of delayed clock signals. Further note that the first and second clock signals have a greater frequency than the input clock signal. The process then proceeds to step 86 where the delay control signal is generated based on the first multiplied clock signal. Note that the delay control signal controls the delay used to generate the plurality of delay clock signals with respect to the input clock signal.

The preceding discussion has presented a method and apparatus for producing multiple clock signals having control duty cycles and phase relationships. With such a method and apparatus, an accurate, yet economical, clock circuit may be produced that supplies multiple clock signals having control duty cycles and controlled phase relationships between the clock signals. As one of average skill in the art would readily appreciate other embodiments may be derived from the teaching of the present invention without deviating from the scope of the claims.

What is claimed is:

1. A clock circuit that produces multiple clock signals, where each of the multiple clock signals has a controlled duty cycle, the clock circuit comprises:
   a plurality of delay blocks that produce a plurality of delayed representations of an input clock signal based on a delay control signal;
   a plurality of logic circuits operably coupled to the plurality of delay blocks, wherein a first logic circuit of the plurality of logic circuits produces a first multiplied clock signal based on a first set of the plurality of delayed representations of the input clock signal and the input clock signal, and wherein a second logic circuit of the plurality of logic circuits produces a second multiplied clock signal based on a second set of plurality of delayed representations of the input clock signal, wherein the second multiplied clock signal is delayed from the first multiplied clock signal in accordance with delay of at least one of the plurality of delay blocks; and
   duty cycle regulation circuit operably coupled to integrate the first multiplied clock signal to produce the delay control signal, wherein the delay control signal controls delay of each of the plurality of delayed representations of the input clock signal with respect to the input clock signal such that duty cycle of the first and the second multiplied clock signals are controlled.

2. The lock circuit of claim 1, wherein each of the plurality of delay blocks comprises a plurality of delay elements and wherein each of the plurality of delay elements includes at least one current starvation transistor and an inverter.

3. The clock circuit of claim 1, wherein each of the plurality of the logic circuits comprises at least one of: an exclusive OR gate, an exclusive NOR gate, and circuitry that performs a Boolean function of $\overline{AB} \oplus \overline{AB}$, where A represents the input clock signal and B represents at least one delayed clock signal of the set first and second sets of the plurality of delayed clock signals, respectively.

4. The clock circuit of claim 1, wherein the duty cycle regulation circuit comprises an integrator module operably coupled to receive the first multiplied clock signal and to produce therefrom at least one of: the delay control signal and a representation of the delay control signal.

5. The clock circuit of claim 1 further comprises:
   a first delay block of the plurality of delay blocks operably coupled to receive the input clock signal and to produce therefrom a first delayed clock signal;

a second delay block of the plurality of delay blocks operably coupled to receive the first delayed clock signal and to produce therefrom a second delayed clock signal;

a third delay block of the plurality of delay blocks operably coupled to receive the second delay clock signal and to produce a third delayed clock signal.

6. The clock circuit of claim 5 further comprises:

the first logic circuit operably coupled to receive the input clock signal and the second delayed clock signal and to produce therefrom the first multiplied clock signal; and the second logic circuit operably coupled to receive the first delayed clock signal and the third delayed clock signal and to produce therefrom the second multiplied clock signal.

7. A method for producing multiple clock signals having controlled duty cycles, the method comprises the steps of:

a) generating a plurality of delayed clock signals from an input clock signal based on a delay control signal;

b) producing a first multiplied clock signal from a first set of the plurality of delayed clock signals and the input clock signal;

c) producing a second multiplied clock signal from a second set of the plurality of delayed clock signals, wherein the second multiplied clock signal is delayed from the first multiplied clock signal in accordance with delay of at least one of the plurality of delayed clock signals; and d) integrating the first multiplied clock signal to produce the delay control signal, wherein the delay control signal controls delays used to generate the plurality of delay clock signals with respect to the input clock signal such that the duty cycle of the first and second multiplied clock signals are controlled.

8. The method of claim 7, wherein steps (b) and (c) each further comprises:

producing the first and second multiplied clock signals utilizing at least one of: an exclusive OR function, an exclusive NOR function, and a Boolean function of A $\overline{B} \oplus \overline{A} B$, where A represents the input clock signal and B represents at least one delayed clock signal of the set first and second set of the plurality of delayed clock signals, respectively.

9. The method claim 7, wherein the generating a plurality of delayed clock signals further comprises:

generating a first delayed clock signal from the input clock signal to produce a first delayed clock signal;

generating a second delayed clock signal from the first delayed clock signal to produce a second delayed clock signal; and generating a third delayed clock signal from the second delayed clock signal to produce a third delayed clock signal.

10. The method of claim 9, wherein the producing the first and second multiplied clock signals further comprises:

producing the first multiplied clock signal based on the input clock signal and the second delayed clock signal; and producing the second multiplied clock signal based on the first delayed clock signal and the third delayed clock signal.

11. An apparatus for producing multiple clock signals having controlled duty cycles, the apparatus comprises:

a processing module; and memory operably coupled to the processing module, wherein the memory stores operational instructions that cause the processing module to: (a) generate a plurality of delayed clock signals from an input clock signal based on a delay control signal; (b) produce a first multiplied clock signal from a first set of the plurality of delayed clock signals and the input clock signal; (c) produce a second multiplied clock signal from a second set of the plurality of delayed clock signals, wherein the second multiplied clock signal is delayed from the first multiplied clock signal in accordance with delay of at least one of the plurality of delayed clock signals; and (d) integrate the first multiplied clock signal to produce the delay control signal, wherein the delay control signal controls delays used to generate the plurality of delay clock signals with respect to the input clock signal such that the duty cycle of the first and second multiplied clock signals are controlled.

12. The apparatus of claim 11, wherein the memory further comprises operational instructions that cause the processing module to:

produce the first and second multiplied clock signals utilizing at least one of: an exclusive OR function, an exclusive NOR function, and a Boolean function of A $\overline{B} \oplus \overline{A} B$, where A represents the input clock signal and B represents at least one delayed clock signal of the set first and second set of the plurality of delayed clock signals, respectively.

13. The apparatus of claim 11, wherein the memory further comprises operational instructions that cause the processing module to generate a plurality of delayed clock signals by:

generating a first delayed clock signal from the input clock signal to produce a first delayed clock signal;

generating a second delayed clock signal from the first delayed clock signal to produce a second delayed clock signal; and generating a third delayed clock signal from the second delayed clock signal to produce a third delayed clock signal.

14. The apparatus of claim 11, wherein the memory further comprises operational instructions that cause the processing module to produce the first and second multiplied clock signals by:

producing the first multiplied clock signal based on the input clock signal and the second delayed clock signal; and producing the second multiplied clock signal based on the first delayed clock signal and the third delayed clock signal.

* * * * *